United States Patent
Orschel et al.

(10) Patent No.: US 7,521,954 B2
(45) Date of Patent: Apr. 21, 2009

(54) METHOD FOR DETERMINING A MINORITY CARRIER DIFFUSION LENGTH USING SURFACE PHOTO VOLTAGE MEASUREMENTS

(75) Inventors: Benno Orschel, Saga (JP); Andrzej Buczkowski, Bend, OR (US); Fritz Kirscht, Berlin (DE)

(73) Assignee: Sumco Corporation, Tokyo (JP)

( * ) Notice: Subject to any disclaimer, the term of this patent is extended or adjusted under 35 U.S.C. 154(b) by 76 days.

(21) Appl. No.: 11/560,472

(22) Filed: Nov. 16, 2006

(65) Prior Publication Data

US 2008/0116909 A1     May 22, 2008

(51) Int. Cl.
    *G01R 31/26*     (2006.01)
    *G01R 31/00*     (2006.01)
    *G01R 21/47*     (2006.01)

(52) U.S. Cl. ............... 324/766; 324/752; 356/446; 250/306

(58) Field of Classification Search .......... 324/752, 324/766–767; 356/432–447
See application file for complete search history.

(56) References Cited

U.S. PATENT DOCUMENTS

| | | | |
|---|---|---|---|
| 4,333,051 A | 6/1982 | Goodman | |
| 4,393,348 A * | 7/1983 | Goldstein et al. | ........... 324/765 |
| 5,177,351 A | 1/1993 | Lagowski | |
| 6,512,384 B1 | 1/2003 | Lagowski et al. | |
| 6,526,372 B1 | 2/2003 | Orschel et al. | |
| 6,922,067 B1 * | 7/2005 | Van et al. | ............ 324/752 |
| 7,026,831 B2 * | 4/2006 | Hermes | ................ 324/752 |
| 7,265,571 B2 * | 9/2007 | Srocka | .................. 324/766 |

OTHER PUBLICATIONS

Schroder, "Surface voltage and surface photovoltage: history, theory and applications," Measurement Science and Technology, vol. 12, 2001, pp. R16-R31.

* cited by examiner

*Primary Examiner*—Ha Tran T Nguyen
*Assistant Examiner*—Emily Y Chan
(74) *Attorney, Agent, or Firm*—Greenblum & Bernstein, P.L.C.

(57) ABSTRACT

A method of determining a diffusion length of a minority carrier in a material which includes applying a first excitation light having a first photon flux to a material, measuring a first surface photo voltage resulting from the application of the first excitation light, applying a second excitation light having a second photon flux to the material, measuring a second surface photo voltage resulting from the application of the second excitation light, applying a third excitation light having a third photon flux, having a predetermined ratio to the first photon flux, to the material, measuring a third surface photo voltage resulting from the application of the third excitation light, determining a diffusion length of a minority carrier in the material based on the measured first, second and third surface photo voltages.

20 Claims, 10 Drawing Sheets

METHOD FOR DETERMINING A MINORITY CARRIER DIFFUSION LENGTH USING SURFACE PHOTO VOLTAGE MEASUREMENTS

BACKGROUND OF THE INVENTION

1. Field of the Invention

The present invention relates to semiconductor materials and, more particularly, to determining a diffusion length of a minority carrier in a semiconductor material.

2. Description of Related Art

When a semiconductor material is processed, it may become contaminated, during one or more processing steps, by a heavy metal, such as iron, for example. Such contamination degrades the semiconductor material, as the contaminants act as recombination centers which eliminate charge carriers in the semiconductor material.

Commonly, contaminants are detected by determining a minority carrier diffusion length of a semiconductor material, which is the distance a minority carrier moves during its lifetime.

To determine a minority carrier diffusion length in a material, minority carriers can be generated in the material by applying an excitation light, such as a laser, to a surface of the material. The number of minority carriers N (also referred to as carrier concentration) that reach the surface of the material as a result of the excitation light is proportional to a photon flux I of the excitation light, and depends on a penetration depth d of the excitation light and the minority carrier diffusion length L of the material. The relationship between L, I, N and d can be described by the following equation:

$$\frac{I}{(d+L)N} = const \qquad (1)$$

The penetration depth d of a material is related to a wavelength λ of the excitation light. For example, the relationship between the penetration depth d of silicon and an excitation wavelength λ can be described by the equation:

$$d = \frac{1}{(83.15/\lambda - 74.87)^2} \qquad (2)$$

The minority carrier diffusion length L of a given material can be determined if the carrier concentration N for two different penetration depths can be measured. That is, since:

$$\frac{I_1}{(d_1+L)N_1} = \frac{I_2}{(d_2+L)N_2}, \qquad (3)$$

then L can be determined from the equation:

$$L = \frac{d_2 I_1/N_1 - d_1 I_2/N_2}{I_2/N_2 - I_1/N_1} \qquad (4)$$

However, the carrier concentration N cannot be measured directly. Rather, N must be determined by measuring a surface photo voltage V of the material, which results from electron-hole pairs reaching the proximity of the surface. The relationship between the carrier concentration N and the surface photo voltage V of a material is complicated, but can be approximated by the parametric formula:

$$N = const(e^{AV} - 1 + SV), \qquad (5)$$

in which A and S are parameters which correspond to properties of the material. A is related to band bending and bandwidth, and S expresses surface recombination. However, the parameters A and S are not stable values. A and S vary with time and have different values at different locations of the material, especially when the material is exposed to light. Unfortunately, illuminating the material with a measurement light can change these parameters.

A known conventional method of determining a minority carrier diffusion length L of a material, described in U.S. Pat. No. 4,333,051, and referred to here as a "Constant Voltage Approach", is described as follows. The theories behind the Constant Voltage Approach are that, if $N_1 = N_2$, equation (4) can be simplified to:

$$L = \frac{d_2 I_1 - d_1 I_2}{I_2 - I_1} \qquad (6)$$

and if $N_1 = N_2$, then $V_1 = V_2$. The dependency between V and N is assumed to be constant in time and not impacted by the illumination of a material with a measurement excitation light.

Thus, in the Constant Voltage Approach, a first excitation light having a photon flux $I_1$, is applied to a subject material at a penetration depth $d_1$. A surface photo voltage $V_1$ is then measured. Next, a second excitation light is applied to the material at a penetration depth $d_2$. The photon flux $I_2$ of the second excitation light is then adjusted until a resulting surface photo voltage $V_2$ is equal to $V_1$. The photon flux $I_2$ which generates the surface photo voltage $V_2$ is then measured. Once the values $I_1$, $d_1$, $I_2$ and $d_2$ are known, the minority carrier diffusion length L of the material can be determined, using equation (6).

However, a flaw of the Constant Voltage Approach is that the adjustment of the photon flux of the second excitation light required by the approach results in a relatively long measurement time. Since the parameters A and S are time dependent, they may change between the measurements of $I_1$ and $I_2$, which results in significant measurement errors. That is, the theory that $N_1$ will equal $N_2$ if $V_1$ equals $V_2$ will not be true, if A or S change between measurements.

A second conventional method of determining a minority carrier diffusion length L of a material, described in U.S. Pat. No. 5,177,351, and referred to here as a "Linear Constant Flux Approach", is described as follows. The Linear Constant Flux Approach does not require time-consuming photon flux adjustment, and thus is faster than the Constant Voltage Approach. Under the Linear Constant Flux Approach, the photon flux of the excitation light is kept constant during the measurement process; that is, $I_1 = I_2$. Thus, equation (4) reduces to:

$$L = \frac{d_2 N_2 - d_1 N_1}{N_1 - N_2} \qquad (7)$$

Assuming that the surface photo voltage V is linearly related to photon flux I and carrier concentration N, equation (7) leads to:

$$L = \frac{d_2 V_2 - d_1 V_1}{V_1 - V_2} \quad (8)$$

For this to be true, the measurement must be carried out at a low enough excitation, so that equation (5) can be replaced by a linear approximation. Unfortunately, voltages are practically immeasurable at such a low excitation.

Thus, the Linear Constant Flux Approach must be performed at elevated voltages $V_1$ and $V_2$ which then fall within the non-linear range of the V-N relationship, in which equation (8) is inaccurate.

In praxis, the excitation level is adjusted to set a certain level of non-linearity of the V-N-relationship. This is done by using a set of two filters of known intensity ratio 2.0 at the same wavelength and adjusting the overall excitation light intensity until a voltage ratio of typically 1.8 is measured. This is done once at a sample center and the light intensity is then fixed for the remaining measurement. It is assumed that at this fixed light intensity the non-linearity is the same at all measurement sites and does not change in time or under exposure to measurement light. Under these assumptions, it is believed that the resulting inaccuracy in equation (8) can be compensated by calibrating the system under the same level of non-linearity.

However, under practical conditions the non-linearity does change under the influence of the measurement light and is different at different measurement sites, causing significant measurement errors. Thus, the Linear Constant Flux Approach suffers from non-linearity errors in addition to errors resulting from the V-N-relation changes between switching light sources.

Another invention, described in U.S. Pat. No. 6,512,384, addresses the problem of the changing V-N-relation between switching light sources by simultaneously measuring the various voltages of different wavelengths. This is done by modulating each light source at a different frequency and illuminating the sample simultaneously with each wavelength. The individual voltages are then extracted from the resulting voltage signal by using harmonic analysis.

This method solves the problem of the changing V-N-relation in time, however, it complicates the non-linearity problem by superimposing several differently modulated photon fluxes. For instance, by using two wavelengths individually producing similar amounts of N at the surface, the peak values of the resulting combined N will reach twice the level. Unfortunately, this will worsen the non-linearity measurement error. In addition, it will enhance measurement artifacts caused by the time dependency of the V-N-relation under light exposure. In addition, by using different modulation frequencies, this method is very likely susceptible to phase shift-frequency dependencies, leading to previously non-existing problems.

Another invention, described in U.S. Pat. No. 6,526,372, also addresses the problem of the V-N-relation time and dependency by simultaneously applying and measuring the various voltages of different wavelengths. However, unlike in U.S. Pat. No. 6,512,384, it does so by a special modulation method that is alternating the various light sources and dark phase in a cyclic fashion, without ever exposing the sample to more than one light source at a time. Thereby, this method avoids enhanced non-linearity error as well as the phase-shift error of the method described in U.S. Pat. No. 6,512,384, but still suffers from the same level of non-linearity error as the Linear Constant Flux Approach.

Another invention, described in U.S. Pat. No. 7,026,831, addresses both original problems, the non-linearity and time dependency under light exposure of the V-N-relation. It does this by alternating the excitation between the different wavelengths and adjusting the individual intensities until the resulting surface potential modulation disappears. The resulting intensities are then used to calculate the diffusion length based on equation (6). Unlike the Constant Voltage Approach, this method is completely insensitive to V-N-relation details, since it does not even measure individual voltages. It works somewhat similar to a compensation bridge measurement, only making sure each light source generates exactly the same N. This fact further allows the use of higher excitation levels, if necessary.

Like the Constant Voltage Approach, this method also involves a time-consuming adjustment of intensities at each measurement site and is therefore potentially slower than methods that work with fixed intensities and only rely on voltage measurements.

SUMMARY OF THE INVENTION

In view of the foregoing, a non-limiting feature of the present invention provides an accurate method of determining the minority carrier diffusion length of a material.

Another non-limiting feature of the present invention is that it reduces measurement errors due to the non-linear V-N-relationship, reduces measurement errors due to the time and light exposure dependency of the V-N-relationship and eliminates the need for time-consuming intensity adjustments at each measurement site.

Another non-limiting feature of the present invention is that it does not require major hardware modification to existing tools.

There is provided a method of determining a diffusion length of a minority carrier in a material which includes applying a first excitation light having a first photon flux to a material, measuring a first surface photo voltage resulting from the application of the first excitation light, applying a second excitation light having a second photon flux to the material, measuring a second surface photo voltage resulting from the application of the second excitation light, applying a third excitation light having a third photon flux to the material, a ratio of the third photon flux to the first photon flux being a known value, measuring a third surface photo voltage resulting from the application of the third excitation light, determining a diffusion length of a minority carrier in the material based on the measured first, second and third surface photo voltages.

The first and second excitation lights may have a first wavelength, and the third excitation light may have a second wavelength. A ratio of the first photon flux to the second photon flux may be a predetermined value.

Determining the diffusion length of a minority carrier may include determining the value of R, where R equals a ratio of a carrier concentration generated by the application of the first excitation light to a carrier concentration generated by the application of the third excitation light. R may be determined from the equation:

$$R = 1 + (R_{Iref} - 1)(R_V - 1)/(R_{Vref} - 1),$$

where $R_{Iref}$ equals a ratio of the first photon flux to the second photon flux, $R_V$ equals a ratio of the first surface photo voltage to the third surface photo voltage, and $R_{Vref}$ equals a ratio of the first surface photo voltage to the second surface photo voltage. The diffusion length of a minority carrier may be determined from the equation:

$$L=(d_2-d_1CR)/(R-1),$$

where $d_1$ is a penetration depth of the first and second excitation lights, $d_2$ is a penetration depth of the third excitation light, and C is the ratio of the third photon flux to the first photon flux.

The method may also include determining a first average surface photo voltage resulting from application of the first excitation light to the material, determining a second average surface photo voltage resulting from application of the second excitation light to the material, determining a third average surface photo voltage resulting from application of the third excitation light to the material, and determining the diffusion length of a minority carrier in the material based on the first, second and third average surface photo voltages.

The first, second and third average surface photo voltages may be determined by repeating a sequence of measurements which includes applying the first excitation light to the material and measuring a resulting surface photo voltage, applying the second excitation light to the material and measuring a resulting surface photo voltage, and applying the third excitation light to the material and measuring a resulting surface photo voltage, where the first average surface photo voltage is determined by averaging the surface photo voltages resulting from applying the first excitation light to the material, the second average surface photo voltage is determined by averaging the surface photo voltages resulting from applying the second excitation light to the material, and the third average surface photo voltage is determined by averaging the surface photo voltages resulting from applying the third excitation light to the material.

There is also provided a method of determining a diffusion length of a minority carrier in a material which includes determining a first average surface photo voltage by averaging a plurality of measured surface photo voltages resulting from applying a first excitation light having a first photon flux to a material, determining a second average surface photo voltage by averaging a plurality of measured surface photo voltages resulting from applying a second excitation light having a second photon flux to the material, determining a third average surface photo voltage by averaging a plurality of measured surface photo voltages resulting from applying a third excitation light having a third photon flux to the material, a ratio of the third photon flux to the first photon flux being a known value, and determining a diffusion length of a minority carrier in the material based on the first, second and third average surface photo voltages.

The first and second excitation lights may have a first wavelength, and the third excitation light may have a second wavelength. Determining the diffusion length of a minority carrier may include determining the value of R, where R equals a ratio of a carrier concentration generated by the application of the first excitation light to a carrier concentration generated by the application of the third excitation light. R may be determined from the equation:

$$R=1+(R_{Iref}-1)(R_V-1)/(R_{Vref}-1),$$

where $R_{Iref}$ equals a ratio of the first photon flux to the second photon flux, $R_V$ equals the ratios of the first average surface photo voltage to the third average surface photo voltage, and $R_{Vref}$ equals a ratio of the first average surface photo voltage to the second average surface photo voltage. The diffusion length of a minority carrier may be determined from the equation:

$$L=(d_2-d_1CR)/(CR-1),$$

where $d_1$ is a penetration depth of the first and second excitation lights, $d_2$ is a penetration depth of the third excitation light, and C is the ratio of the third photon flux to the first photon flux.

There is also provided a computer-readable medium which stores a program for determining a diffusion length of a minority carrier in a material. The program includes a first surface photo voltage value receiving code segment for receiving a first surface photo voltage value obtained by applying a first excitation light having a first photon flux to a material, a second surface photo voltage value receiving code segment for receiving a second surface photo voltage value obtained by applying a second excitation light having a second photon flux to the material, a third surface photo voltage value receiving code segment for receiving a third surface photo voltage value obtained by applying a third excitation light having a third photon flux to the material, a ratio of the third photon flux to the first photon flux being a known value, and a minority carrier diffusion length determination code segment that determines a diffusion length of a minority carrier in the material based on the first, second and third surface photo voltage values.

The first and second excitation lights may have a first wavelength, and the third excitation light may have a second wavelength. A ratio of the first photon flux to the second photon flux may be a predetermined value.

The minority carrier diffusion length determination code segment may determine the value of R, where R equals a ratio of a carrier concentration generated by the application of the first excitation light to a carrier concentration generated by the application of the third excitation light. The minority carrier diffusion length determination code segment may determine R from the equation:

$$R=1+(R_{Iref}-1)(R_V-1)/(R_{Vref}-1),$$

where $R_{Iref}$ equals a ratio of the first photon flux to the second photon flux, $R_V$ equals a ratio of the first surface photo voltage value to the third surface photo voltage value, and $R_{Vref}$ equals a ratio of the first surface photo voltage value to the second surface photo voltage value. The minority carrier diffusion length determination code segment may determine the diffusion length of a minority carrier from the equation:

$$L=(d_2-d_1CR)/(CR-1),$$

where $d_1$ is a penetration depth of the first and second excitation lights, and $d_2$ is a penetration depth of the third excitation light.

The first, second and third surface photo voltage values may be obtained by averaging surface photo voltage measurements.

Other exemplary embodiments and advantages of the present invention may be ascertained by reviewing the present disclosure and the accompanying drawings.

BRIEF DESCRIPTION OF THE DRAWINGS

The present invention is described in the detailed description that follows, with reference to the following noted drawings which illustrate non-limiting examples of embodiments of the present invention, and in which like reference numerals represent similar parts throughout the drawings.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention.

One premise of the present invention is that equation (7) can be rewritten as:

$$L=(d_2-d_1 CR)/(CR-1), \quad (9)$$

where $C=I_2/I_1$ and $R=N_1/N_2$. Further, if $N_1$ is referred to as $N_{ref0}$ and $I_1$ is referred to as $I_{ref0}$, then R can be expressed as $R=N_{ref0}/N_2$ and C can be expressed as $C=I_2/I_{ref0}$.

Figure 1:
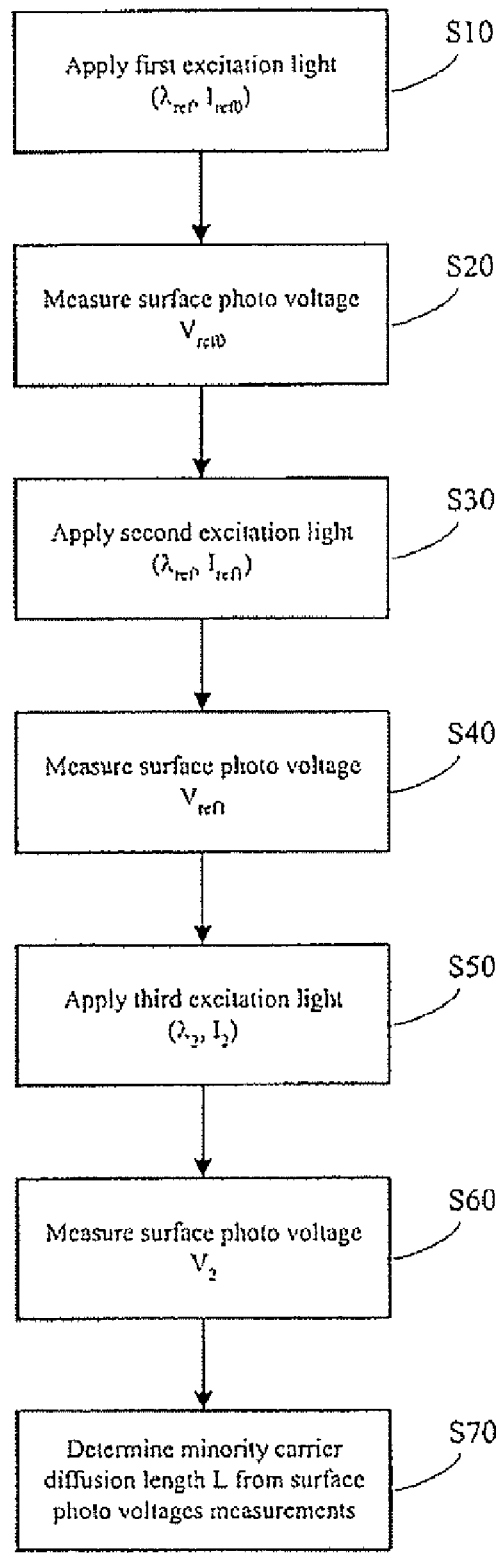
FIG. 1 shows a flowchart of a process of determining the minority carrier diffusion length of a material.

A process of determining the minority carrier diffusion length L of a material is described below with reference to the flowchart shown in FIG. 1.

First, a first excitation light having a reference wavelength $\lambda_{ref}$ and a first photon flux $I_{ref0}$ is applied to a subject material (step S10), generating a carrier concentration $N_{ref0}$, and a resulting surface photo voltage $V_{ref0}$ is measured (step S20). Next, a second excitation light having the reference wavelength $\lambda_{ref}$ and a second photon flux $I_{ref1}$, is applied to the material (step S30), generating a carrier concentration $N_{ref1}$, and a resulting surface photo voltage $V_{ref1}$ is measured (step S40). The value of the second photon flux $I_{ref1}$ is chosen by a user such that the ratio $I_{ref0}/I_{ref1}$ is a predetermined value, such as 2, for example.

Next, a third excitation light having a second wavelength $\lambda_2$ and a photon flux $I_2$ (where the ratio $C_2=I_2/I_{ref0}$ is known) is applied to the material (step S50), generating a carrier concentration $N_2$, and a resulting surface photo voltage $V_2$ is measured (step S60).

The ratio $N_{ref0}/N_{ref1}$ is known, since $N_{ref0}/N_{ref1}=I_{ref0}/I_{ref1}$. However, the ratio $N_{ref0}/N_2$, which is needed to determine the minority carrier diffusion length L, is unknown.

Due to the non-linear relationship between photon flux and surface photo voltage, the ratio of photo voltages $R_{Vref}=V_{ref0}/V_{ref1}$ approaches 1 as $I_{ref0}$ and $I_{ref1}$ approach infinity. Further, as $I_{ref0}$ and $I_{ref1}$ approach zero, the ratio of photo voltages $R_{Vref}=V_{ref0}/V_{ref1}$ approaches the ratio of photon fluxes $R_{Iref}=I_{ref0}/I_{ref1}$, which is also equal to the ratio of carrier concentrations $R_{Nref}=N_{ref0}/N_{ref1}$.

Similarly, the ratio $R_V=V_{ref0}/V_2$ approaches 1 as $I_{ref0}$ and $I_2$ approach infinity, and as $I_{ref0}$ and $I_2$ approach zero, the ratio $R_V=V_{ref0}/V_2$ approaches the ratio $R_{I2}=I_{ref0}/I_2$, which is also equal to the ratio of $R=N_{ref0}/N_2$ which is to be solved.

Based on the above, using linear extrapolation, the following first order approximation may be generated:

$$R=1+(R_{Iref}-1)(R_V-1)/(R_{Vref}-1) \quad (10)$$

The process continues by determining R using equation (10) and the known values of $\lambda_{ref}$, $\lambda_2$, $I_{ref0}$, $I_{ref1}$, $I_2$, $V_{ref0}$, $V_{ref1}$ and $V_2$. The minority carrier diffusion length L of the material is then determined using equation (9)(step S70). This procedure may be expanded to use additional wavelengths besides $\lambda_2$ to measure voltages in addition to $V_2$.

To increase the accuracy of the above-described process of determining the minority carrier diffusion length, a measurement method, referred to here as "quasi simultaneous modulation", may be used to measure the surface photo voltages.

As discussed above, the surface conditions of the material fluctuate over time. The quasi simultaneous modulation method reduces the effect of the fluctuations, as it takes average voltage measurements over a period. According to the quasi simultaneous modulation method, $V_{ref0}$, $V_{ref1}$ and $V_2$ are sequentially measured as described above. This sequence of measurements is then repeated a predetermined number of times, and the average values of $V_{ref0}$, $V_{ref1}$ and $V_2$ are determined. The average values of $V_{ref0}$, $V_{ref1}$ and $V_2$ are then used to determine R using equation (10) above.

Figure 2:
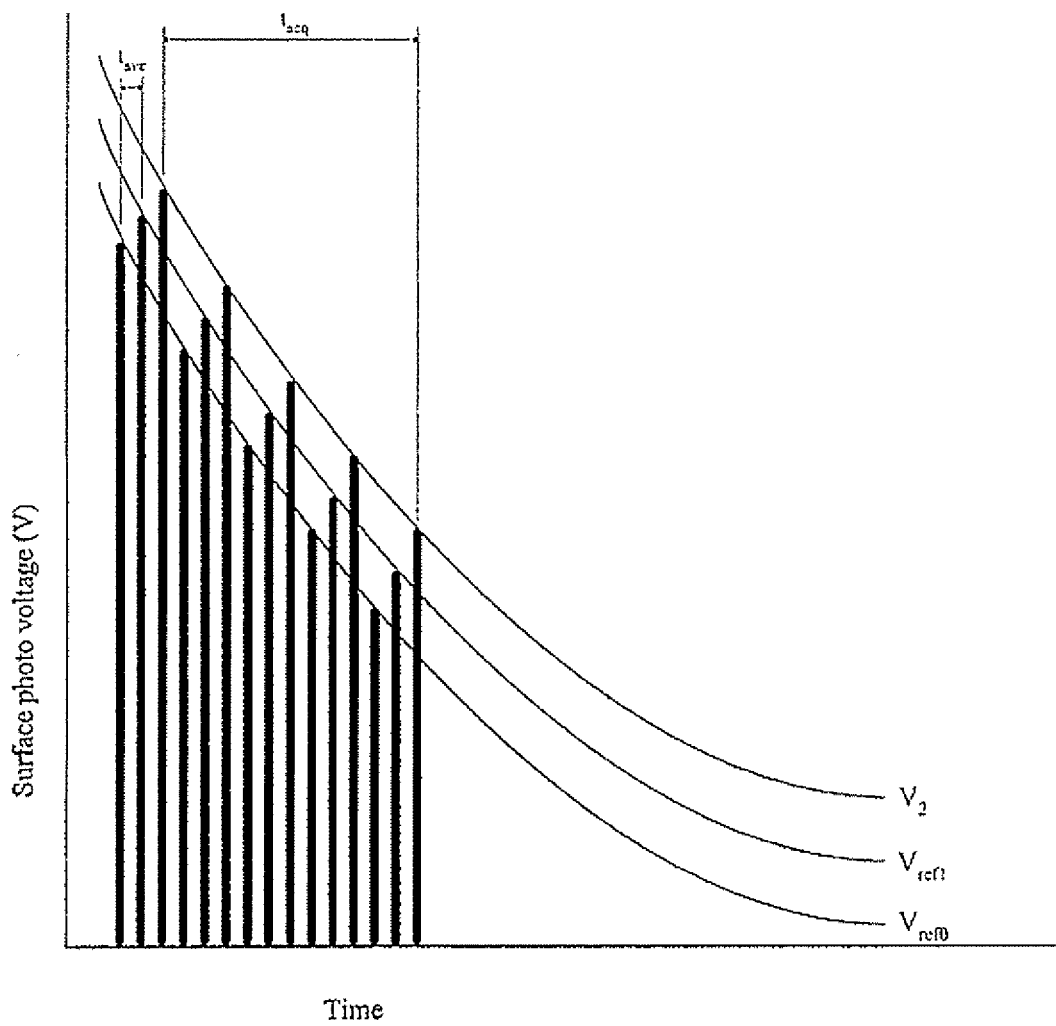
FIG. 2 shows a graph illustrating a quasi simultaneous modulation method.

FIG. 2 illustrates an example of the quasi simultaneous method, in which five measurements of $V_{ref0}$, $V_{ref1}$ and $V_2$ are taken. As shown in FIG. 2, the average moment between measurements, $t_{ave}$, is much smaller than the averaging period, $t_{acq}$, which minimizes measurement errors resulting from the instability of the surface electrical properties of the material.

Figure 3:
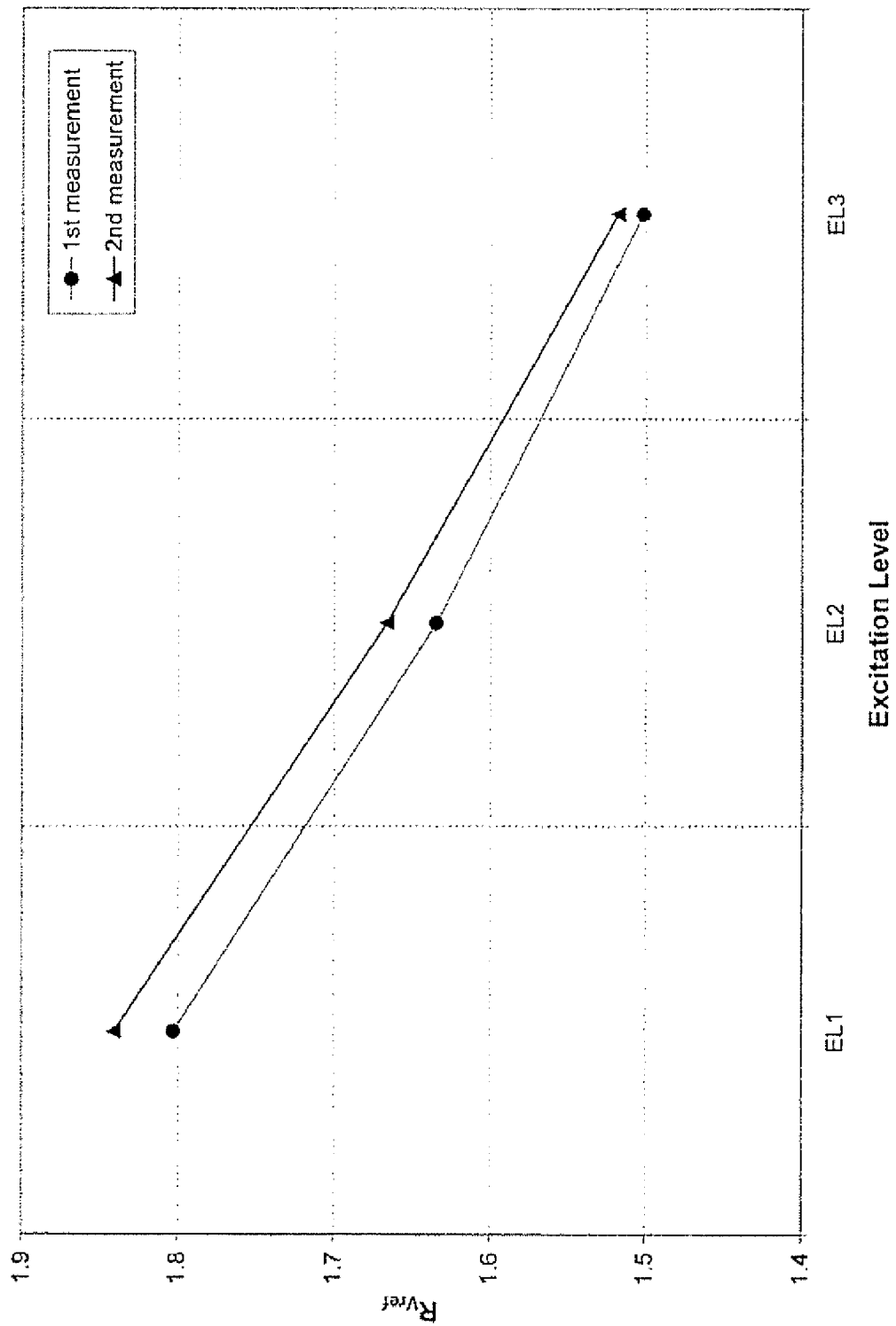
FIG. 3 shows a plot of $R_{Vref}$ as a function of excitation level.
Figure 4:
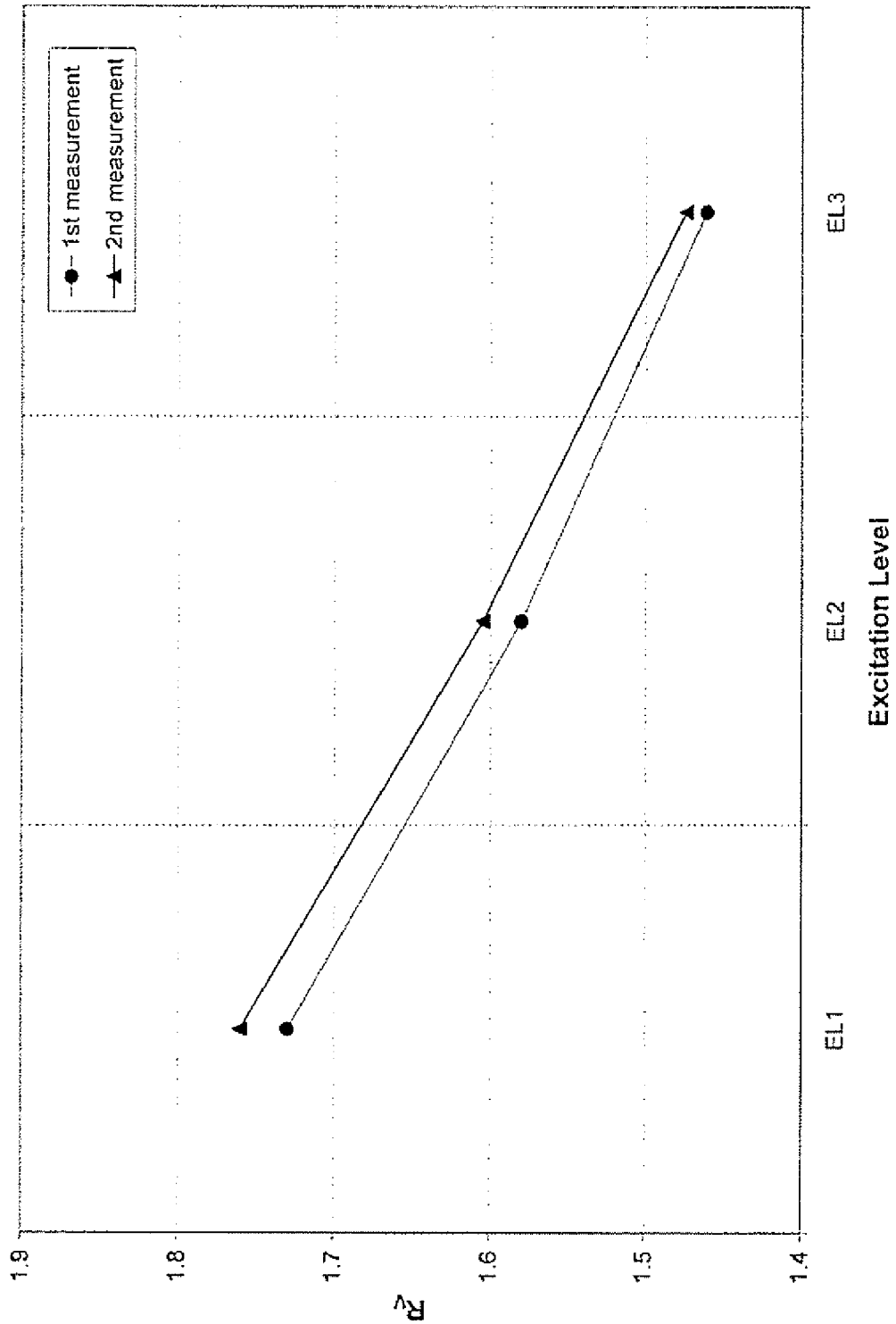
FIG. 4 shows a plot of $R_V$ as a function of excitation level.
Figure 5:
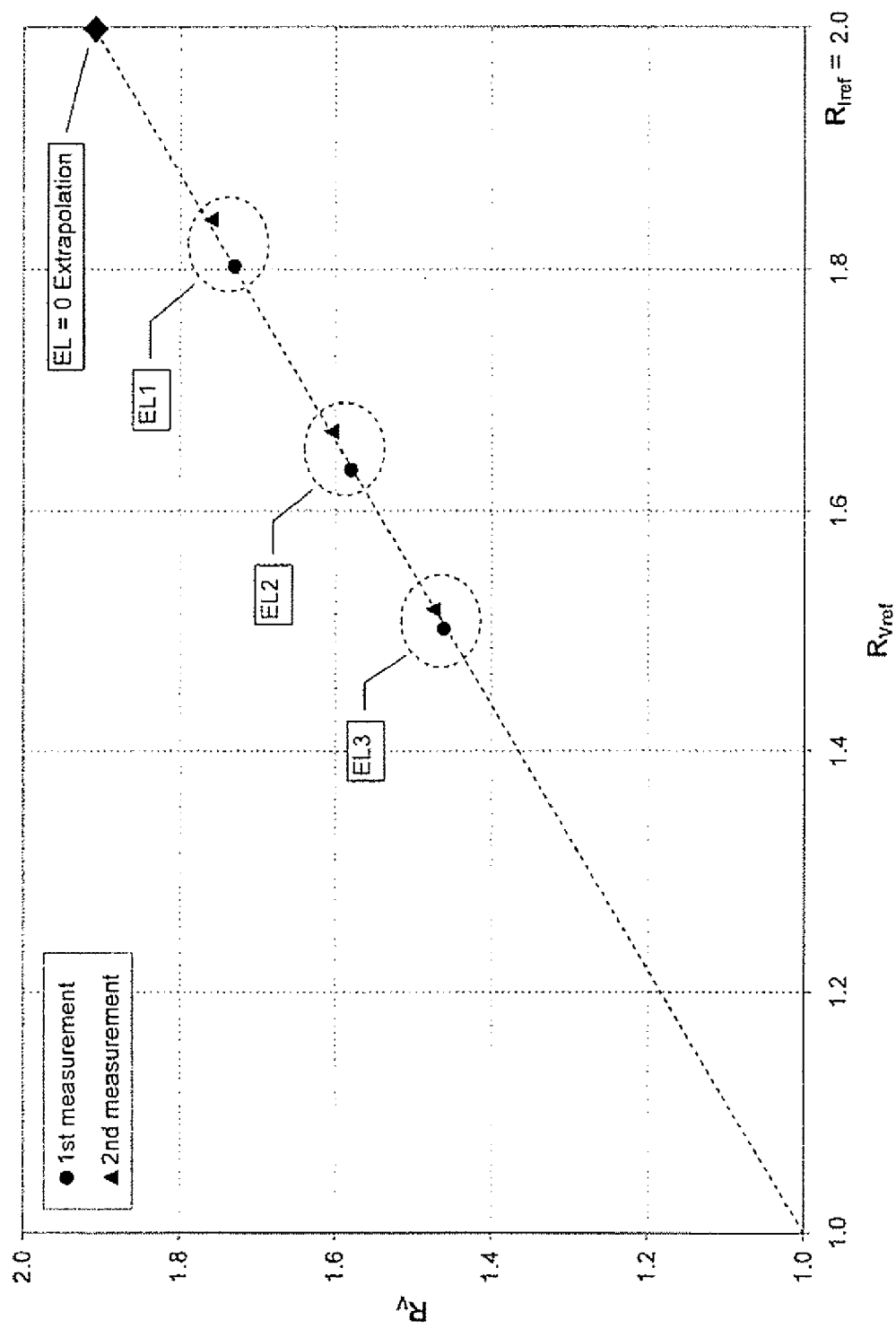
FIG. 5 shows a parametric $R_V$-$R_{Vref}$-plot.

FIG. 3 shows a plot of $R_{Vref}$ as a function of excitation level. FIG. 4 shows a plot of $R_V$ as a function of excitation level. FIG. 5 shows a parametric $R_V$-$R_{Vref}$ plot.

As a result of their similar excitation level dependency, all $\{R_V, R_{Vref}\}$ pairs approximately lie along a line which crosses $\{1, 1\}$ at infinite excitation levels and $\{R_{Iref}, R_{V0}\}$ at zero excitation level. $R_{Iref}$ is the known intensity ratio that is used for measuring the reference voltage. $R_{Iref}$ equals 2 in the present example. This makes it possible to approximate the zero excitation voltage ratio by linear extrapolation according to $$R=1+(R_{Iref}-1)(R_V-1)/(R_{Vref}-1)$$

In the present case, a reference intensity ratio of $R_{Iref}=2.0$ was used, which simplifies the equation to $$R=1+(R_V-1)/(R_{Vref}-1)$$

Figure 6:
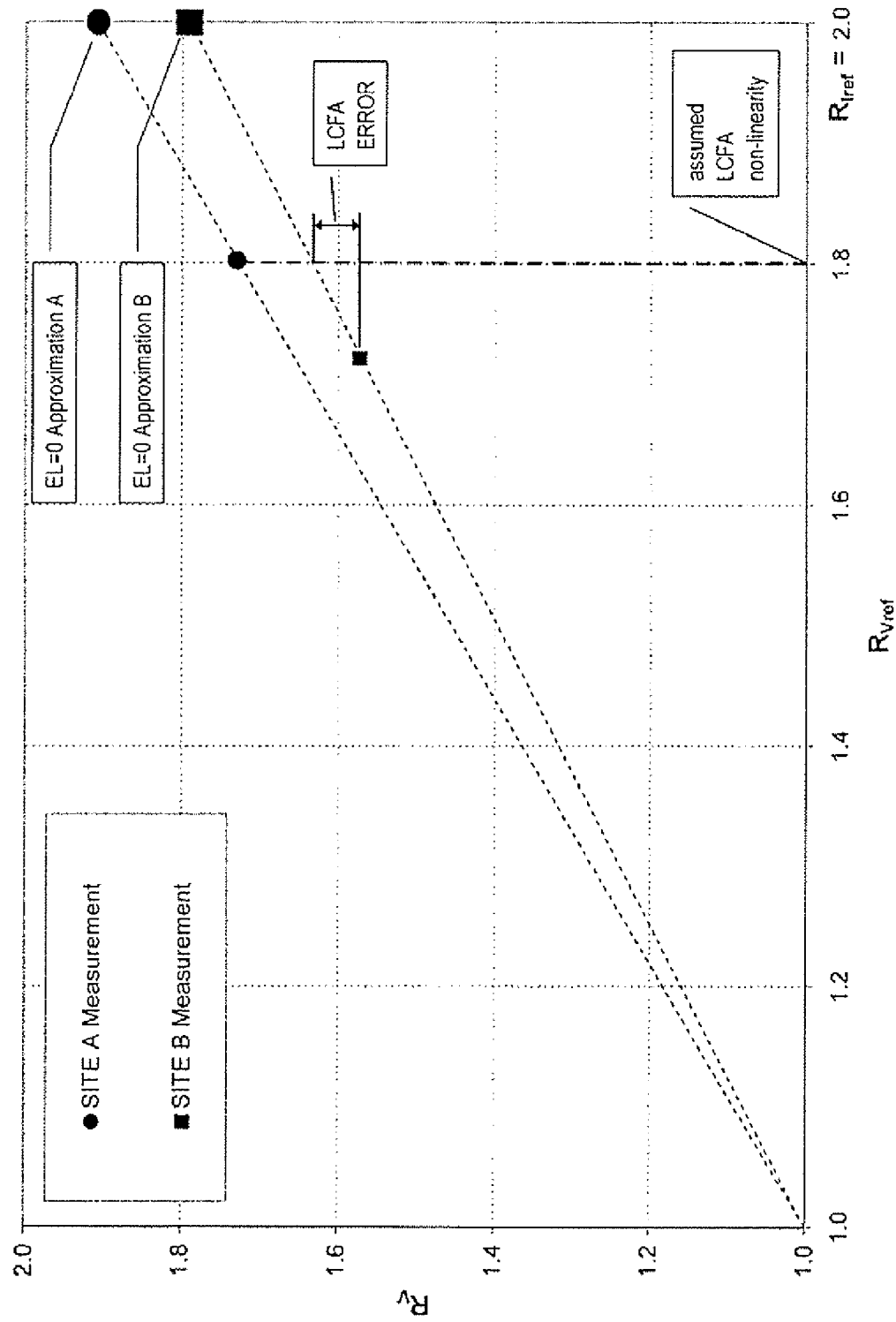
FIG. 6 shows two $\{R_V, R_{Vref}\}$ pairs, measured on the same sample and at the same excitation level, but at different sites.

FIG. 6 shows two $\{R_V, R_{Vref}\}$ pairs, measured on the same sample and at the same excitation level, but at different sites. The zero excitation level approximations are shown for each measurement. For comparison to prior art, the measurement error that would occur in Linear Constant Flux based prior art at site B is shown (LCFA Error). This error results from the fact that all Linear Constant Flux methods make the incorrect assumption that the reference ratio $R_{Vref}$ is the same at all measurement sites and to constant in time.

Figure 7:
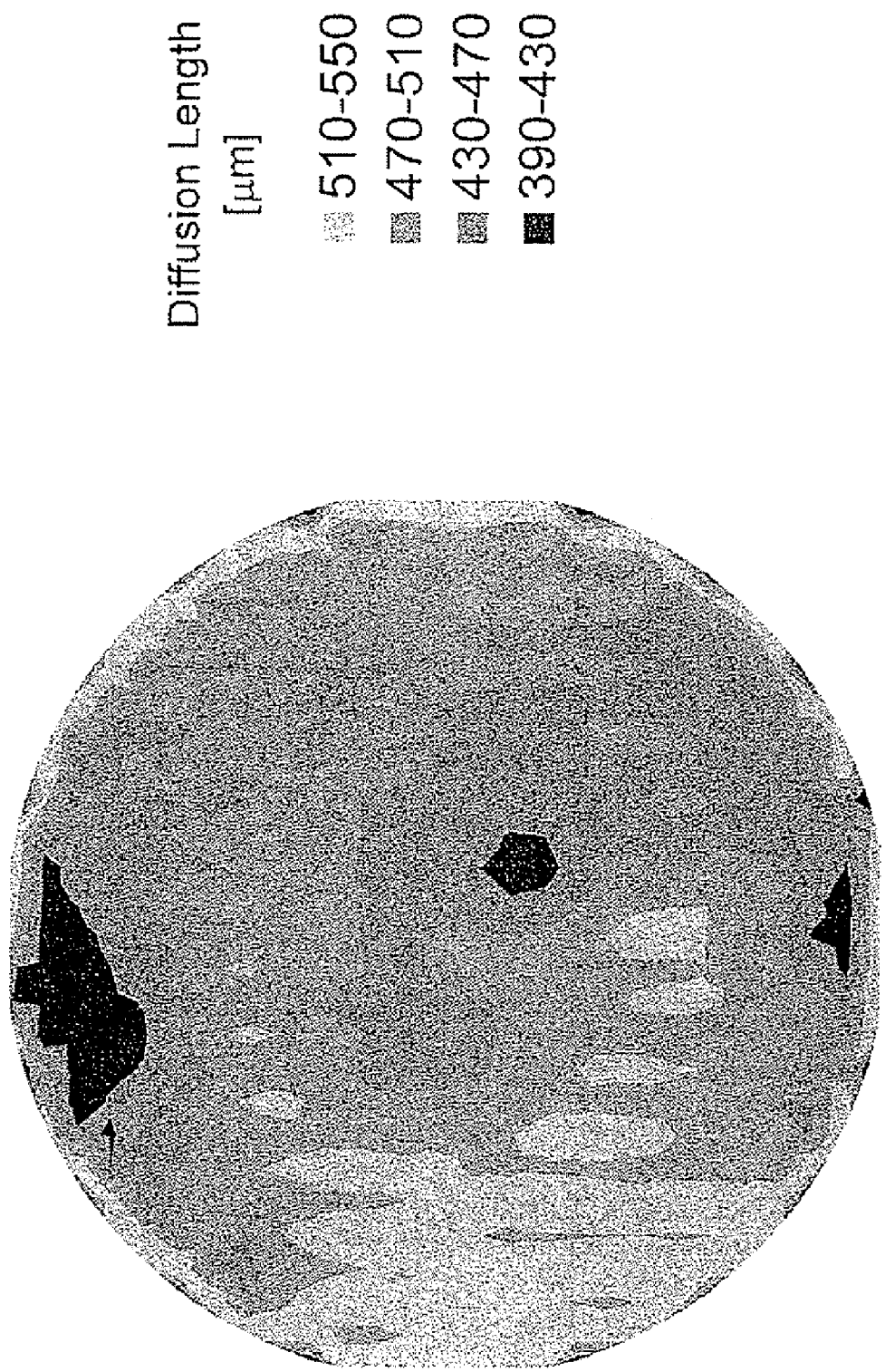
FIG. 7 shows the diffusion length according to the traditional Linear Constant Flux Approach measured over an entire silicon wafer.

FIG. 7 shows the diffusion length according to the traditional Linear Constant Flux Approach measured over an entire silicon wafer. The measurements where taken along vertical lines in bi-directional motion. The diffusion length image shows three areas of low diffusion length (black). Also clearly visible is a stripe pattern that is aligned with the scan direction.

Figure 8:
FIG. 8 shows the reference voltage ratio $R_{Vref}$ that corresponds to FIG. 7.

FIG. 8 shows the reference voltage ratio $R_{V_{ref}}$ that corresponds to FIG. 7. FIG. 8 shows that, contrary to the basic assumption of all Linear Constant Flux Approach methods, the non-linearity of the N-V-relation is not constant over the sample. In addition to the lateral variations it is also impacted by the excitation light, resulting in an additional time dependency. In high resolution mode, this sensitivity to excitation light causes clearly visible artifacts that are aligned with the scan direction, when the spot of excitation light extends to neighboring measurement sites.

Figure 9:
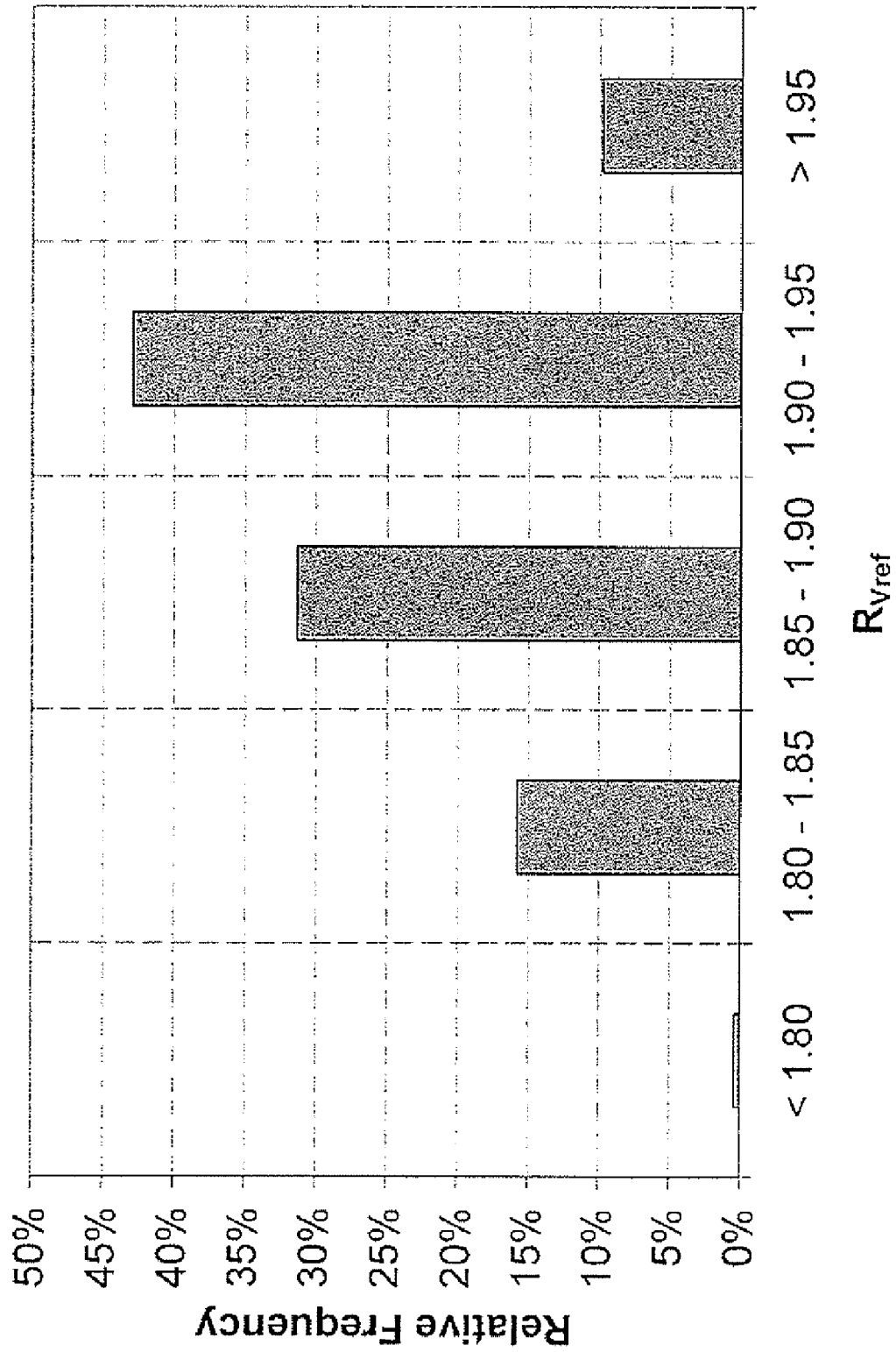
FIG. 9 shows the distribution of reference voltage ratios, to illustrate the amount of non-linearity variation on a typical sample.

FIG. 9 shows the distribution of reference voltage ratios, to illustrate the amount of non-linearity variation on a typical sample. The typical variation range of $R_{V_{ref}}$ is a significant error source in prior art Constant Flux Approach methods.

Figure 10:
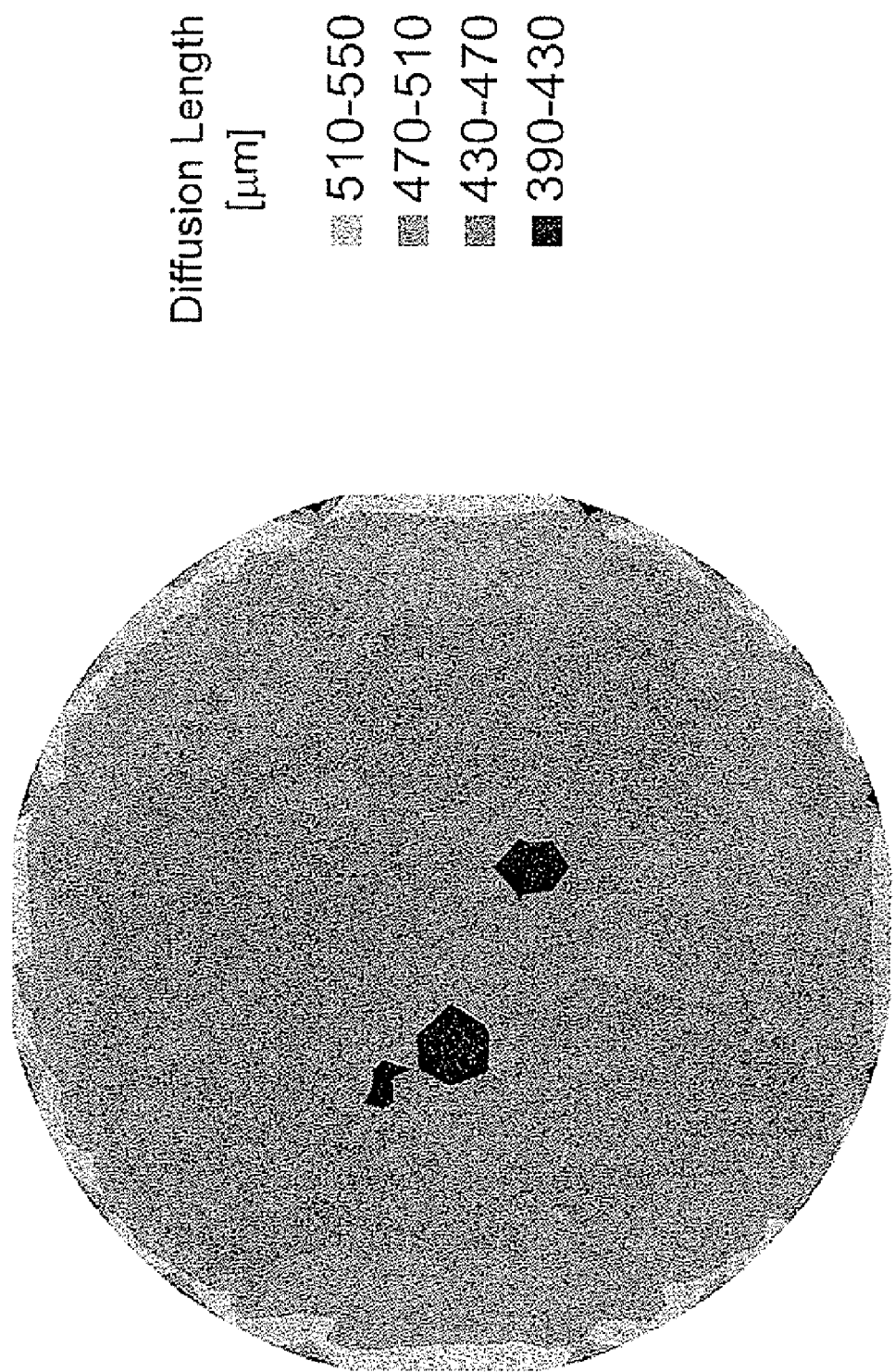
FIG. 10 shows a diffusion length result of the present invention

FIG. 10 shows the diffusion length result according to the present invention. In contrast to FIG. 7, all artifacts are eliminated. Most notably, the scan line artifact is absent in FIG. 10, but also the two low diffusion length spots on top and bottom in FIG. 7 turn out to be non-linearity related artifacts.

The process described above for determining a minority carrier diffusion level is more accurate than the conventional techniques, in that it compensates for the non-linearity between surface photo voltage and photon flux. Thus, it allows the use of surface photovoltage measurements taken at higher photon fluxes, which exhibit better signal-to-noise ratios, even though these surface photovoltages have a non-linear relationship to photon flux.

The process described above may be implemented, for example, by providing the known and measured values of $\lambda_{ref}$, $\lambda_2$, $I_{ref0}$, $I_{ref1}$, $V_{ref0}$, $V_{ref1}$ and $V_2$ to a processor, such as a computer, and determining a minority carrier diffusion level therefrom using a software program, which is executed by the processor.

The foregoing embodiments and advantages are merely exemplary and are not to be construed as limiting the present invention. The description of the present invention is intended to be illustrative, and not to limit the scope of the claims. Many alternatives, modifications, and variations will be apparent to those skilled in the art.

In accordance with various embodiments of the present disclosure, the methods described herein may be implemented by software programs executable by a processor. The present disclosure contemplates a computer-readable medium that includes instructions or receives and executes instructions responsive to a propagated signal. The term "computer-readable medium" shall include any medium that is capable of storing, encoding or carrying a set of instructions for execution by a processor to perform any one or more of the methods or operations disclosed herein.

In a particular non-limiting, exemplary embodiment, the computer-readable medium can include a solid-state memory such as, for example, a memory card or other package that houses one or more non-volatile read-only memories. Further, the computer-readable medium may be a random access memory or other volatile re-writable memory. Accordingly, the disclosure is considered to include any one or more of a computer-readable medium or a distribution medium and other equivalents and successor media, in which data or instructions may be stored.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

Although the invention has been described with reference to an exemplary embodiment, it is understood that the words that have been used are words of description and illustration, rather than words of limitation. As the present invention may be embodied in several forms without departing from the spirit or essential characteristics thereof, it should also be understood that the above-described embodiment is not limited by any of the details of the foregoing description, unless otherwise specified. Rather, the above-described embodiment should be construed broadly within the spirit and scope of the present invention as defined in the appended claims. Therefore, changes may be made within the metes and bounds of the appended claims, as presently stated and as amended, without departing from the scope and spirit of the invention in its aspects.

What is claimed is:

1. A method of determining a diffusion length of a minority carrier in a material, comprising:
    applying a first excitation light having a first photon flux and a first wavelength to a material;
    measuring a first surface photo voltage resulting from the application of the first excitation light;
    applying a second excitation light having a second photon flux and the first wavelength to the material;
    measuring a second surface photo voltage resulting from the application of the second excitation light;
    applying a third excitation light having a third photon flux and a second wavelength to the material, a ratio of the third photon flux to the first photon flux being a known value;
    measuring a third surface photo voltage resulting from the application of the third excitation light; and
    determining a diffusion length of a minority carrier in the material based on the measured first, second and third surface photo voltages.

2. The method according to claim 1, wherein a ratio of the first photon flux to the second photon flux is a predetermined value.

3. The method according to claim 1, further comprising:
    determining a first average surface photo voltage resulting from application of the first excitation light to the material;
    determining a second average surface photo voltage resulting from application of the second excitation light to the material;
    determining a third average surface photo voltage resulting from application of the third excitation light to the material; and
    determining the diffusion length of a minority carrier in the material based on the first, second and third average surface photo voltages.

4. The method according to claim 3, wherein the first, second and third average surface photo voltages are determined by repeating a sequence of measurements which comprises:
    applying the first excitation light to the material and measuring a resulting surface photo voltage;
    applying the second excitation light to the material and measuring a resulting surface photo voltage; and
    applying the third excitation light to the material and measuring a resulting surface photo voltage,
    wherein the first average surface photo voltage is determined by averaging the surface photo voltages resulting from applying the first excitation light to the material, the second average surface photo voltage is determined by averaging the surface photo voltages resulting from applying the second excitation light to the material, and the third average surface photo voltage is determined by averaging the surface photo voltages resulting from applying the third excitation light to the material.

5. The method according to claim 1, wherein determining the diffusion length of a minority carrier in the material comprises linearly approximating a ratio of a carrier concentration generated by the application of the first excitation light to a carrier concentration generated by the application of the third excitation light, based on the first and second surface photo voltage measurements.

6. A method of determining a diffusion length of a minority carrier in a material, comprising:
    applying a first excitation light having a first photon flux to a material;
    measuring a first surface photo voltage resulting from the application of the first excitation light;
    applying a second excitation light having a second photon flux to the material;
    measuring a second surface photo voltage resulting from the application of the second excitation light;
    applying a third excitation light having a third photon flux to the material, a ratio of the third photon flux to the first photon flux being a known value;
    measuring a third surface photo voltage resulting from the application of the third excitation light; and
    determining a diffusion length of a minority carrier in the material based on the measured first, second and third surface photo voltages,
    wherein determining the diffusion length of a minority carrier comprises determining the value of R, where R equals a ratio of a carrier concentration generated by the application of the first excitation light to a carrier concentration generated by the application of the third excitation light.

7. The method according to claim 6, wherein R is determined from the equation:

$$R = 1 + (R_{Iref} - 1)(R_V - 1)/(R_{Vref} - 1),$$

where $R_{Iref}$ equals a ratio of the first photon flux to the second photon flux, $R_V$ equals a ratio of the first surface photo voltage to the third surface photo voltage, and $R_{Vref}$ equals a ratio of the first surface photo voltage to the second surface photo voltage.

8. The method according to claim 6, wherein the diffusion length L of a minority carrier is determined from the equation:

$$L = (d_2 - d_1 CR)/(CR - 1),$$

where $d_1$ is a penetration depth of the first and second excitation lights, and $d_2$ is a penetration depth of the third excitation light and C is the ratio of the third photon flux to the first photon flux.

9. A method of determining a diffusion length of a minority carrier in a material, comprising:
    determining a first average surface photo voltage by averaging a plurality of measured surface photo voltages resulting from applying a first excitation light having a first photon flux and a first wavelength to a material;
    determining a second average surface photo voltage by averaging a plurality of measured surface photo voltages resulting from applying a second excitation light having a second photon flux and the first wavelength to the material;
    determining a third average surface photo voltage by averaging a plurality of measured surface photo voltages resulting from applying a third excitation light having a third photon flux and a second wavelength to the material, a ratio of the third photon flux to the first photon flux being a known value; and
    determining a diffusion length of a minority carrier in the material based on the first, second and third average surface photo voltages.

10. A method of determining a diffusion length of a minority carrier in a material, comprising:
    determining a first average surface photo voltage by averaging a plurality of measured surface photo voltages resulting from applying a first excitation light having a first photon flux to a material;
    determining a second average surface photo voltage by averaging a plurality of measured surface photo voltages resulting from applying a second excitation light having a second photon flux to the material;
    determining a third average surface photo voltage by averaging a plurality of measured surface photo voltages resulting from applying a third excitation light having a third photon flux to the material, a ratio of the third photon flux to the first photon flux being a known value; and
    determining a diffusion length of a minority carrier in the material based on the first, second and third average surface photo voltages,
    wherein determining the diffusion length of a minority carrier comprises determining the value of R, where R equals a ratio of a carrier concentration generated by the application of the first excitation light to a carrier concentration generated by the application of the third excitation light.

11. The method according to claim 10, wherein R is determined from the equation:

$$R = 1 + (R_{Iref} - 1)(R_V - 1)/(R_{Vref} - 1),$$

where $R_{Iref}$ equals a ratio of the first photon flux to the second photon flux, $R_V$ equals a ratio of the first average surface photo voltage to the third average surface photo voltage, and $R_{Vref}$ equals a ratio of the first average surface photo voltage to the second average surface photo voltage.

12. The method according to claim 10, wherein the diffusion length L of a minority carrier is determined from the equation:

$$L=(d_2-d_1CR)/(CR-1),$$

where $d_1$ is a penetration depth of the first and second excitation lights, and $d_2$ is a penetration depth of the third excitation light and C is the ratio of the third photon flux to the first photon flux.

13. The method according to claim 9, wherein determining the diffusion length of a minority carrier in the material comprises linearly approximating a ratio of a carrier concentration generated by the application of the first excitation light to a carrier concentration generated by the application of the third excitation light, based on the first and second average surface photo voltages.

14. A computer-readable medium which stores a program for determining a diffusion length of a minority carrier in a material, the program comprising:

a first surface photo voltage value receiving code segment for receiving a first surface photo voltage value obtained by applying a first excitation light having a first photon flux and a first wavelength to a material;

a second surface photo voltage value receiving code segment for receiving a second surface photo voltage value obtained by applying a second excitation light having a second photon flux and the first wavelength to the material;

a third surface photo voltage value receiving code segment for receiving a third surface photo voltage value obtained by applying a third excitation light having a third photon flux and a second wavelength to the material, a ratio of the third photon flux to the first photon flux being a known value; and a minority carrier diffusion length determination code segment that determines a diffusion length of a minority carrier in the material based on the first, second and third surface photo voltage values.

15. The computer-readable medium according to claim 14, wherein a ratio of the first photon flux to the second photon flux is a predetermined value.

16. The computer-readable medium according to claim 14, wherein the first, second and third surface photo voltage values are obtained by averaging surface photo voltage measurements.

17. The computer-readable medium according to claim 14, wherein the minority carrier diffusion length determination code segment determines the diffusion length of a minority carrier in the material by linearly approximating a ratio of a carrier concentration generated by the application of the first excitation light to a carrier concentration generated by the application of the third excitation light, based on the first and second average surface photo voltage values.

18. A computer-readable medium which stores a program for determining a diffusion length of a minority carrier in a material, the program comprising:

a first surface photo voltage value receiving code segment for receiving a first surface photo voltage value obtained by applying a first excitation light having a first photon flux to a material;

a second surface photo voltage value receiving code segment for receiving a second surface photo voltage value obtained by applying a second excitation light having a second photon flux to the material;

a third surface photo voltage value receiving code segment for receiving a third surface photo voltage value obtained by applying a third excitation light having a third photon flux to the material, a ratio of the third photon flux to the first photon flux being a known value; and a minority carrier diffusion length determination code segment that determines a diffusion length of a minority carrier in the material based on the first, second and third surface photo voltage values, wherein the minority carrier diffusion length determination code segment determines the value of R, where R equals a ratio of a carrier concentration generated by the application of the first excitation light to a carrier concentration generated by the application of the third excitation light.

19. The computer-readable medium according to claim 18, wherein the minority carrier diffusion length determination code segment determines R from the equation:

$$R=1+(R_{Iref}-1)(R_V-1)/(R_{Vref}-1),$$

where $R_{Iref}$ equals a ratio of the first photon flux to the second photon flux, $R_V$ equals a ratio of the first surface photo voltage value to the third surface photo voltage value, and $R_{Vref}$ equals a ratio of the first surface photo voltage value to the second surface photo voltage value.

20. The computer-readable medium according to claim 18, wherein the minority carrier diffusion length determination code segment determines the diffusion length L of a minority carrier from the equation:

$$L=(d_2-d_1CR)/(CR-1),$$

where $d_1$ is a penetration depth of the first and second excitation lights, and $d_2$ is a penetration depth of the third excitation light and C is the ratio of the third photon flux to the first photon flux.

* * * * *